United States Patent
Yeh et al.

(10) Patent No.: US 9,905,701 B2
(45) Date of Patent: Feb. 27, 2018

(54) ACTIVE DEVICE STRUCTURE WITH OXIDE CHANNEL LAYER HAVING DEGREE OF CRYSTALLINITY AND METHOD THEREOF

(71) Applicant: Au Optronics Corporation, Hsinchu (TW)

(72) Inventors: Po-Liang Yeh, New Taipei (TW); Chen-Chung Wu, Kaohsiung (TW); Chun-An Chang, Hsinchu (TW); Jiang-Jin You, Taoyuan (TW); Chia-Ming Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/072,301

(22) Filed: Mar. 16, 2016

(65) Prior Publication Data

US 2016/0300951 A1    Oct. 13, 2016

(30) Foreign Application Priority Data

Apr. 13, 2015   (TW) .............................. 104111798 A

(51) Int. Cl.
*H01L 29/786* (2006.01)
*H01L 27/12* (2006.01)
(Continued)

(52) U.S. Cl.
CPC .... *H01L 29/7869* (2013.01); *H01L 21/02164* (2013.01); *H01L 21/02274* (2013.01);
(Continued)

(58) Field of Classification Search
CPC ............. H01L 29/7869; H01L 27/1225; H01L 27/1229
See application file for complete search history.

(56) References Cited

U.S. PATENT DOCUMENTS 7,719,479 B2    5/2010   Hsu et al.
8,129,719 B2    3/2012   Yamazaki et al.
(Continued)

FOREIGN PATENT DOCUMENTS

CN    102648526    8/2012
CN    102693918    9/2012
(Continued)

OTHER PUBLICATIONS

Siderov et al., "Structural Properties of Silicon Oxide Prepared by High-Power PECVD", Dec. 2013, XIV International Conference on Micro/Nanotehnologies and Electron Devices EDM, pp. 43-45.*
(Continued)

*Primary Examiner* — Evan Pert
(74) *Attorney, Agent, or Firm* — JCIPRNET

(57) ABSTRACT

An active device structure and a method of fabricating an active device are provided. The active device structure includes a gate, an oxide channel layer, a source, a drain and a high power deposited insulation layer. The gate and the oxide channel layer are overlapped in a top and bottom manner. The oxide channel layer includes a top layer and a bottom layer having a crystalline structure different from a crystalline structure of the top layer. The source and the drain both contact the oxide channel layer, wherein a gap separating the source and the drain defines a channel area. The high power deposited insulation layer contacts the top layer of the oxide channel layer. The top layer of the oxide channel layer provides the effect of blocking light, which solves the problem of threshold voltage shift due to the light irradiation on the oxide channel layer.

18 Claims, 7 Drawing Sheets

(51) Int. Cl.
  *H01L 29/04* (2006.01)
  *H01L 29/24* (2006.01)
  *H01L 29/66* (2006.01)
  *H01L 21/477* (2006.01)
  *H01L 21/02* (2006.01)

(52) U.S. Cl.
  CPC ........ *H01L 21/477* (2013.01); *H01L 27/1225* (2013.01); *H01L 27/1229* (2013.01); *H01L 29/04* (2013.01); *H01L 29/24* (2013.01); *H01L 29/66969* (2013.01); *H01L 29/78606* (2013.01); *H01L 29/78648* (2013.01); *H01L 29/78696* (2013.01)

(56) References Cited

U.S. PATENT DOCUMENTS

| | | | |
|---|---|---|---|
| 8,148,721 B2* | 4/2012 | Hayashi | H01L 27/1225 257/43 |
| 8,502,217 B2 | 8/2013 | Sato et al. | |
| 8,624,245 B2 | 1/2014 | Yamazaki | |
| 8,766,329 B2 | 7/2014 | Endo et al. | |
| 8,853,689 B2 | 10/2014 | Hsu et al. | |
| 8,901,556 B2 | 12/2014 | Okazaki et al. | |
| 8,927,349 B2 | 1/2015 | Yamazaki | |
| 8,987,074 B2* | 3/2015 | Xie | H01L 29/78606 257/72 |
| 9,048,094 B2 | 6/2015 | Miyanaga et al. | |
| 9,246,013 B2* | 1/2016 | Ahmed | H01L 29/66969 |
| 9,318,317 B2 | 4/2016 | Okazaki et al. | |
| 9,324,881 B2 | 4/2016 | Yamazaki | |
| 9,520,288 B2 | 12/2016 | Miyanaga et al. | |
| 9,570,626 B2 | 2/2017 | Okazaki et al. | |
| 9,735,284 B2 | 8/2017 | Yamazaki | |
| 2008/0316137 A1 | 12/2008 | Hsu et al. | |
| 2010/0283049 A1 | 11/2010 | Sato et al. | |
| 2011/0133191 A1 | 6/2011 | Yamazaki | |
| 2011/0227060 A1 | 9/2011 | Miyanaga et al. | |
| 2012/0319175 A1 | 12/2012 | Endo et al. | |
| 2013/0264563 A1 | 10/2013 | Okazaki et al. | |
| 2013/0330914 A1 | 12/2013 | Miyanaga et al. | |
| 2014/0103334 A1 | 4/2014 | Xie et al. | |
| 2014/0106506 A1 | 4/2014 | Yamazaki | |
| 2014/0110700 A1 | 4/2014 | Hsu et al. | |
| 2015/0072535 A1 | 3/2015 | Okazaki et al. | |
| 2015/0097188 A1 | 4/2015 | Yamazaki | |
| 2015/0171227 A1* | 6/2015 | Ahmed | H01L 29/66969 257/43 |
| 2015/0340506 A1 | 11/2015 | Miyanaga et al. | |
| 2016/0197194 A1 | 7/2016 | Okazaki et al. | |
| 2016/0211382 A1 | 7/2016 | Yamazaki | |
| 2017/0125601 A1 | 5/2017 | Okazaki et al. | |

FOREIGN PATENT DOCUMENTS

| | | |
|---|---|---|
| CN | 202443973 | 9/2012 |
| CN | 102832252 | 12/2012 |
| CN | 103299430 | 9/2013 |
| CN | 103779421 | 5/2014 |
| CN | 104185898 | 12/2014 |
| TW | 200901559 | 1/2009 |
| TW | 200941724 | 10/2009 |
| TW | 201130138 | 9/2011 |
| TW | 201140827 | 11/2011 |
| TW | 201304145 | 1/2013 |
| TW | 201405665 | 2/2014 |
| TW | 201434788 | 9/2014 |

OTHER PUBLICATIONS

Omura et al., "First-priniples study of native point defects in crystalline gallium zinc oxide", May 2009, Journal of Applied Physics 105, 093712 (2009), 8 pages.*

* cited by examiner

ACTIVE DEVICE STRUCTURE WITH OXIDE CHANNEL LAYER HAVING DEGREE OF CRYSTALLINITY AND METHOD THEREOF

CROSS-REFERENCE TO RELATED APPLICATION

This application claims the priority benefit of Taiwan application serial no. 104111798, filed on Apr. 13, 2015. The entirety of the above-mentioned patent application is hereby incorporated by reference herein and made a part of this specification.

BACKGROUND OF THE INVENTION

Field of the Invention

The invention relates to an active device and a method of fabricating said active device. In particular, the invention relates to an active device structure having an oxide channel layer and a method for fabricating said active device structure.

Description of Related Art

In recent years, using an oxide semiconductor film consisting Indium (In), Gallium (Ga), Zinc (Zn), and Oxygen (O) (hereinafter referred to as IGZO) to form a channel layer of a thin film transistor has been researched and implemented in practice. Although the oxide semiconductor film can form the channel layer of the thin film transistor, the electrical characteristics of the oxide semiconductor film would change after the oxide semiconductor film is exposed to the light irradiation (for example, carriers transitions to the conduction band) so that the threshold voltage of the thin film transistor shifts correspondingly. Therefore, using the oxide semiconductor film to form the channel layer of the active device causes an instability problem.

SUMMARY OF THE INVENTION

The invention provides an active device structure having better stability.

The invention provides a method of fabricating the active device structure, wherein the active device structure having better stability is fabricated.

The invention provides an active device structure which includes a gate, an oxide channel layer, a source, a drain, and a high power deposited insulation layer. The gate and the oxide channel layer are overlapped in a top and bottom manner. The oxide channel layer includes a top layer and a bottom layer having a crystalline structure different from a crystalline structure of the top layer. The source and the drain both contact with the oxide channel layer, wherein a gap separating the source and the drain defines a channel area on the oxide channel layer. The high power deposited insulation layer contacts with the top layer of the oxide channel layer.

In one embodiment of the invention, the material of the high power deposited insulation layer includes silicon oxide.

In one embodiment of the invention, a ratio of the thickness of the top layer to the thickness of the bottom layer is from 1:5 to 1:9.

In one embodiment of the invention, the crystalline structure of the top layer is body-centered cubic (BBC) or face-centered cubic (FCC).

In one embodiment of the invention, the bottom layer has an amorphous crystalline structure.

In one embodiment of the invention, the oxygen content of the top surface is lower than the oxygen content of the bottom surface.

In one embodiment of the invention, the active device structure further includes a gate insulating layer, wherein the gate insulating layer locates between the gate and the oxide channel layer, and the oxide channel layer, the source, and the drain locate between the high power deposited insulation layer and the gate insulating layer.

In one embodiment of the invention, the active device structure further includes a protective layer, wherein the high power deposited insulation layer locates between the gate and the oxide channel layer.

In one embodiment of the invention, the material of the top layer and the bottom layer of the oxide channel layer includes indium gallium zinc oxide.

In one embodiment of the invention, the surface area of the top layer of the oxide channel layer is approximately equal to the contact area of the oxide channel layer and the high power deposited insulation layer.

The invention provides a method of fabricating the active device structure which includes, firstly, forming a gate, an oxide channel layer, a source, and a drain. The gate and the oxide channel layer are overlapped in a top and bottom manner. The source and the drain both contact with the oxide channel layer, and a gap separating the source and the drain defines a channel area on the oxide channel layer. After that, a high power depositing step is performed to form a high power deposited insulation layer which contacts the oxide channel layer. The value of energy density of the high power depositing step is from 0.14 W/cm$^2$ to 0.37 W/cm$^2$. Sequentially, an annealing step is performed for the oxide channel layer including the bottom layer and the top layer which contact with the high power deposited insulation layer, and the crystalline structure of the top layer is different from the crystalline structure of the bottom layer. The processing temperature of the annealing step is from 200° C. to 300° C.

In one embodiment of the invention, value of energy density of the high power depositing step is from 0.21 W/cm$^2$ to 0.28 W/cm$^2$.

In one embodiment of the invention, the annealing step is performed under atmospheric environment.

In one embodiment of the invention, the processing temperature of the annealing step is 230° C., and the annealing step is performed in 120 minutes.

In one embodiment of the invention, the annealing step is performed after the high power depositing step.

In one embodiment of the invention, the high power deposited insulation layer is formed between the gate and the oxide channel layer.

In one embodiment of the invention, the method of fabricating the active device structure further includes forming a gate insulating layer between the gate and the oxide channel layer. The oxide channel layer, the source, and the drain are all formed between the high power deposited insulation layer and the gate insulating layer.

In one embodiment of the invention, the material of the high power deposited insulation layer includes silicon oxide.

Based on the above, in the active device structure and the method of fabricating the active device structure according to embodiments of the invention, the oxide channel layer which contacts with the high power deposited insulation layer is divided into the top layer and the bottom layer with different crystalline structures, and the top layer can function to provide the effect of blocking light. Hence, the design of the embodiments of the invention can improve the phenomenon that the carrier (such as electrons) jumps to the conduction band early when the oxide channel layer is exposed to the light irradiation. In other words, the threshold voltage shift of the active device structure of the embodiments of the invention is not easily occurred so that the active device structure has a better stability.

In order to make the aforementioned and other features and advantages of the invention more comprehensible, embodiments accompanying figures are described in detail below.

DESCRIPTION OF THE EMBODIMENTS

Figure 1A:
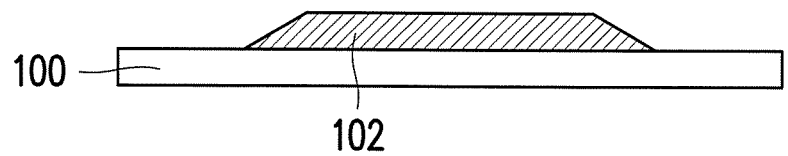
FIGS. 1A to 1F show the flows of a method of fabricating an active device structure according to one embodiment of the invention.

FIGS. 1A to 1F show the flows of a method of fabricating an active device structure according to one embodiment of the invention. Referring to FIG. 1A, a substrate 100 is provided, and a gate 102 is formed on the substrate 100. In this embodiment, the substrate 100 is, for example, a rigid substrate or a flexible substrate. To be more specific, the material of the substrate 100 can be glass, plastic, composite material, or other materials that can provide support and can be used to fabricate a plate-structure. In addition, the material of the gate 102 is conductive material. For example, the gate 102 can be a single metal layer or a stack of multiple metal layers, and the metal can be Copper (Cu), Molybdenum (Mo), Titanium (Ti), Aluminum (Al), Tungsten (W), Silver (Ag), Gold (Au), or an alloy of at least one of above-mentioned metals. In this embodiment, the gate 102 is patterned and fabricated via photolithography process, but the invention is not limited thereto.

Figure 1B:
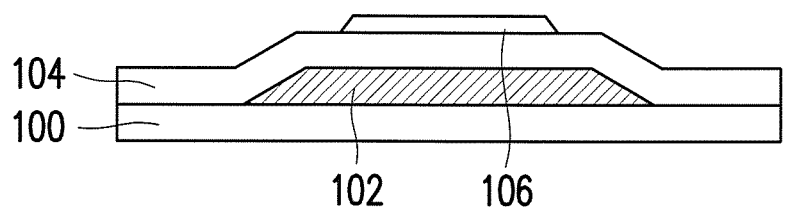

Referring to FIG. 1B. A gate insulating layer 104 is formed on both the substrate 100 and the gate 102, wherein the gate insulating layer 104 covers both the substrate 100 and the gate 102. In other words, the gate 102 locates between the substrate 100 and the gate insulating layer 104. In this embodiment, the gate insulating layer 104 can have a single layer structure or a multilayer stack composite structure, and the material of the gate insulating layer 104 is, for example, silicon nitride, silicon oxide, silicon oxynitride, or other appropriate dielectric materials.

Referring to FIG. 1B, after the gate insulating layer 104 is fabricated, an oxide channel layer 106 is formed on the gate insulating layer 104. The gate 102 and the oxide channel layer 106 are overlapped in a top and bottom manner and separated by the gate insulating layer 104. In other words, the projected area of the oxide channel layer 106 on the substrate 100 overlaps the projected area of the gate 102 on the substrate 100. In this embodiment, the material of the oxide channel layer 106 includes at least one of tin oxide, indium oxide, gallium oxide, and zinc oxide. In the following parts, the material of the oxide channel layer 106 is zinc-indium-tin oxide as an example, but the invention is not limited thereto.

Figure 1C:
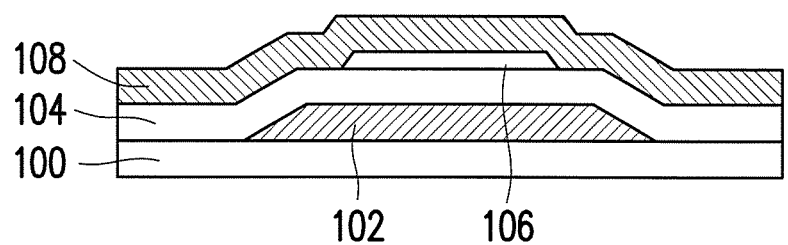

However, referring to FIG. 1C. After the gate insulating layer 106 is fabricated, a metal layer 108 is formed on the oxide channel layer 106. The metal layer 108 can have a single layer structure or a multilayer stack composite structure, and material of the metal layer 108 is, for example, Aluminum (Al), Molybdenum (Mo), Silver (Ag), Palladium (Pd), or other alloy materials. The material of the metal layer 108 can be similar to or different from the material of the gate 102.

Figure 1D:
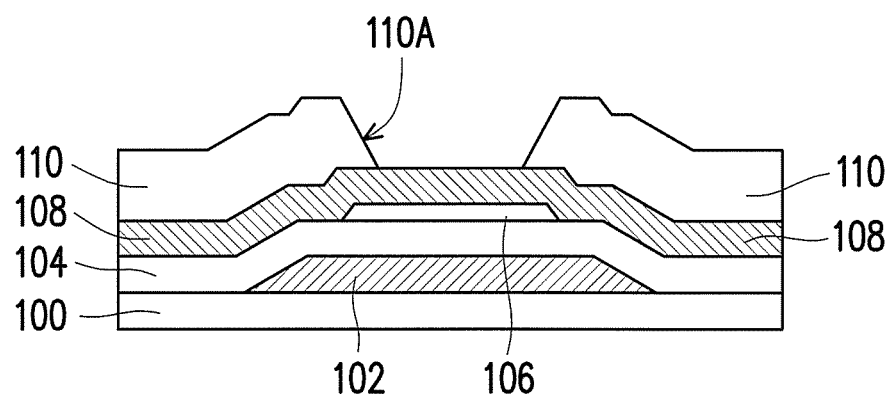

Sequentially, referring to FIG. 1D. A patterned photoresist layer 110 is formed on the metal layer 108, the patterned photoresist layer 110 is configured to define the patterns of the source 108a and the drain 108b that are formed subsequently. As shown in FIG. 1D, the patterned photoresist layer 110 is disposed on the metal layer 108, and the patterned photoresist layer 110 has an opening 110A which is corresponding to the oxide channel layer 106, so as to expose a portion of the metal layer 108.

Figure 1E:
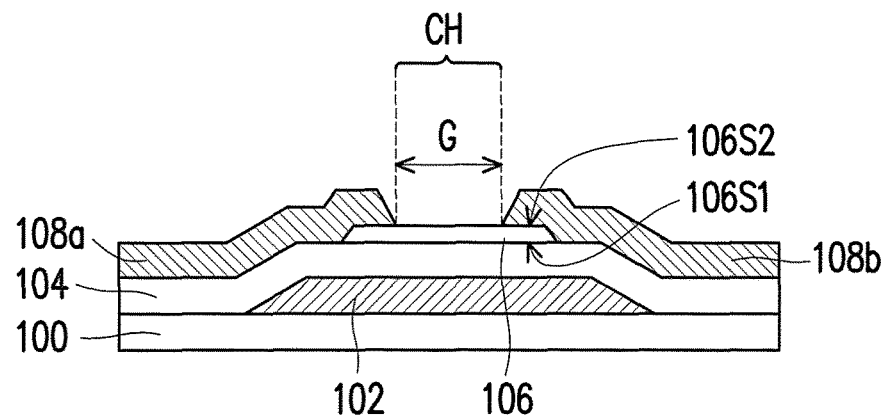

Sequentially, referring to FIGS. 1D and 1E. After the patterned photoresist layer 110 is formed, the portion of the metal layer 108 which is not covered by the patterned photoresist layer 110 is removed by an etching process, and the source 108a and the drain 108b are completely fabricated. In addition, as shown in FIG. 1E, the source 108a and the drain 108 is separated by a gap G and a channel area CH is defined on the oxide channel layer 106 corresponding to the gap G. To be more specific, in one embodiment of the invention, the source 108a and the drain 108b can be patterned by using the wet etchant, in which the wet etchant is, for example, phosphoric acid, nitric acid and acetic acid, or combination of at least two of the above-mentioned. In another embodiment, the wet etchant also can be orthoaluminic acid.

It is shown in FIG. 1E that the source 108a and the drain 108b both contact with the oxide channel layer 106 and locate at two sides of the channel area CH. The gate 102 locates on the first side 106S1 of the oxide channel layer 106, the source 108a and the drain 108b locate on the second side 106S2 of the oxide channel layer 106, and the first side 106S1 is opposite to the second side 106S2. Simultaneously, the gate 102 locates between the oxide channel layer 106 and the substrate 100, so as to construct a bottom gate structure.

Figure 1F:
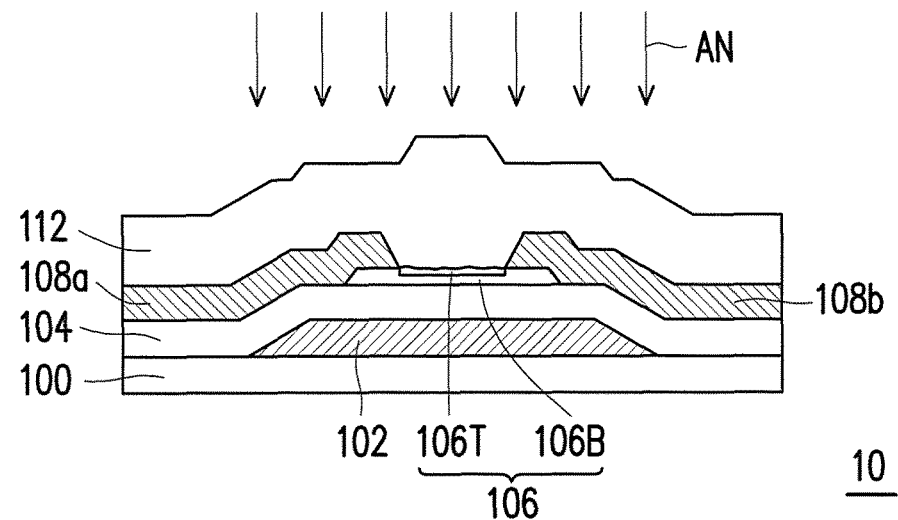

Referring to FIG. 1F, after the source 108a and the drain 108b are formed, a high power depositing step is performed so that the high power deposited insulation layer 112 is formed on the oxide channel layer 106. In this embodiment, a value of energy density of the high power depositing step can be from 0.14 W/cm$^2$ to 0.37 W/cm$^2$, or from 0.21 W/cm$^2$ to 0.28 W/cm$^2$. The high power depositing step uses chemical vapor deposition (CVD), and reaction gases of the chemical vapor deposition include nitrous oxide ($N_2O$) and silane ($SiH_4$). Simultaneously, the volume ratio of the nitrous oxide ($N_2O$) and silane ($SiH_4$) in the high power depositing step is between 55~70. In addition, the material of the high power deposited insulation layer 112 includes silicon oxide, silicon oxynitride, or other combinations.

In this embodiment, after the high power depositing step, an annealing step is further performed, wherein, the processing temperature of the annealing step is from 200° C. to 300° C., and the annealing step is performed under atmospheric environment. When the high power depositing step and the annealing step are performed, the crystalline structure of a portion of the oxide channel layer 106 contacting the high power deposited insulation layer 112 would be changed after being subjected to a sufficient energy. Therefore, the structure of the oxide channel layer 106, which contacts to the high power deposited insulation layer 112, is changed and divided into the bottom layer 106B and the top layer 106T, wherein the distribution area of the top layer 106T is approximately equal to the contact area of the oxide channel layer 106 and the high power deposited insulation layer 112. The crystalline structure of the top layer 106T is different from the crystalline structure of the bottom layer 106B, and the top layer 106T is closer to the high power deposited insulation layer 112 than the bottom layer 106B. In other words, the top layer 106T locates between the bottom layer 106B and the high power deposited insulation layer 112.

The materials of the top layer 106T and the bottom layer 106B of the oxide channel layer 106 include indium, tin, and zinc compounds, but oxygen content of the top layer 106T can be lower than the oxygen content of the bottom layer 106B. The ratio of the thickness of the top layer 106T to the thickness of the bottom layer 106B lies from 1:5 to 1:9. In this embodiment, the degree of crystallinity of the top layer 106T is higher than the degree of crystallinity of the bottom layer 106B. The crystalline structure of the top layer 106T of the oxide channel layer 106 is, for example, body-centered cubic (BBC) or face-centered cubic (FCC), and the crystalline structure of the bottom layer 106B is an amorphous crystalline structure.

Figure 2A:
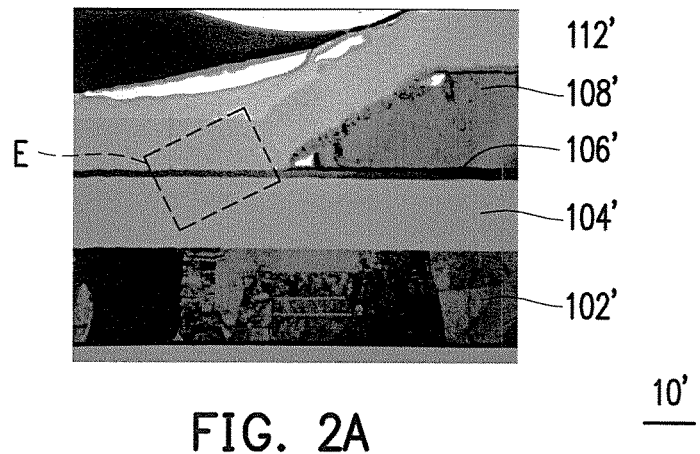
FIG. 2A is a transmission electron microscope picture of a local region of a specific example of the active device structure.
Figure 2B:
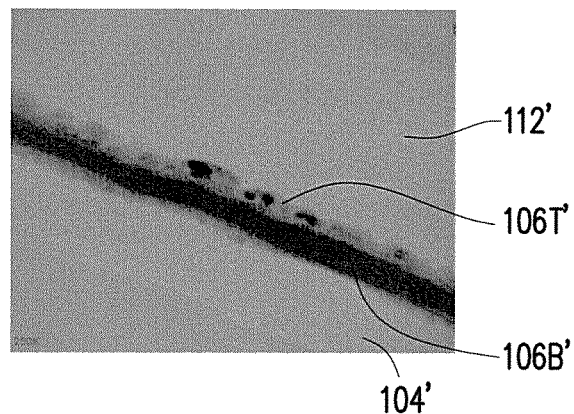
FIG. 2B is a partially enlarged view of an area E depicted in FIG. 2A.
Figure 2C:
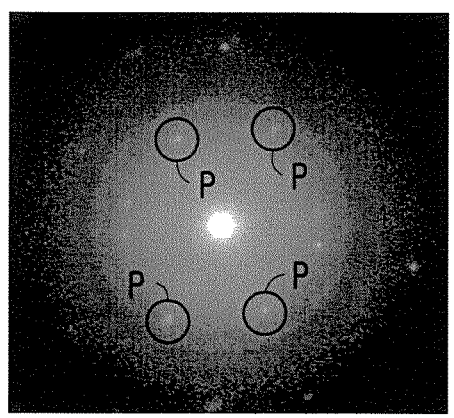
FIG. 2C is a diffraction pattern analyzed by the transmission electron microscope of the top layer of the oxide channel layer in FIG. 2B.

FIG. 2A is a transmission electron microscope picture of a local region of a specific example of the active device structure. FIG. 2B is a partially enlarged view of an area E depicted in FIG. 2A. In addition, FIG. 2C is a diffraction pattern analyzed by the transmission electron microscope of the top layer of the oxide channel layer in FIG. 2B. To be more specific, the gate 102', the gate insulating layer 104', the oxide channel layer 106', the electrode 108' served as the source or the drain, and the high power deposited insulation layer 112' of the active device structure 10' are shown in FIG. 2A. In this specific example, during the depositing step of the high power deposited insulation layer 112', value of energy density is 0.21 W/cm². After fabricating the high power deposited insulation layer 112', the annealing step is performed subsequently, the processing temperature of the annealing step is around 230° C., and the annealing step is performed in around 120 minutes. Based on FIGS. 2A to 2C, especially FIG. 2B, the oxide channel layer 106' which contacts with the high power deposited insulation layer 112' is distinctly divided into top and bottom layers, the top layer 106T' contacts with the high power deposited insulation layer 112' and has a relatively more unflattened structure than the bottom layer 106B', and the bottom layer 106B' is relatively closer to the gate insulating layer 104' and has a relatively more flattened structure than the top layer 106T'. Base on the lattice points P presented in the diffraction pattern in FIG. 2C, it can be further understood that crystalline structure of the top layer 106T' generally is a body-centered cubic (BCC) structure.

Figure 2D:
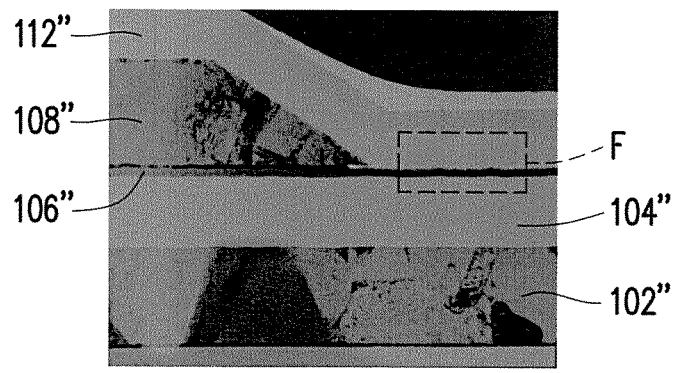
FIG. 2D is another transmission electron microscope picture of a local region of a specific example of the active device structure.
Figure 2E:
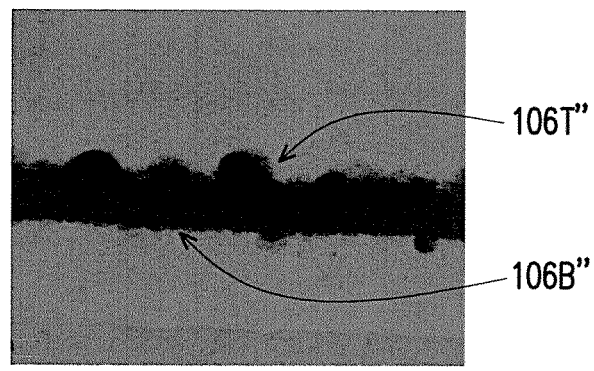
FIG. 2E is a partially enlarged view of an area F depicted in FIG. 2D.
Figure 2F:
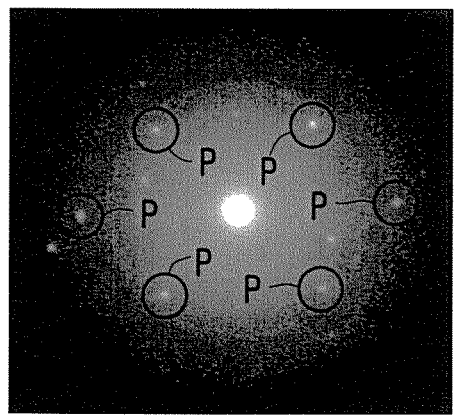
FIG. 2F is a diffraction pattern analyzed by the transmission electron microscope of the top layer of the oxide channel layer in FIG. 2E.

FIG. 2D is another transmission electron microscope picture of a local region of a specific example of the active device structure. FIG. 2E is a partially enlarged view of an area F depicted in FIG. 2D. In addition, FIG. 2F is a diffraction pattern analyzed by the transmission electron microscope of the top layer of the oxide channel layer in FIG. 2E. To be more specific, the gate 102", the gate insulating layer 104", the oxide channel layer 106", the electrode 108" served as the source or the drain, and the high power deposited insulation layer 112" of the active device structure 10' are shown in FIG. 2D. In this specific example, during the depositing step of the high power deposited insulation layer 112", value of energy density is 0.28 W/cm². After fabricating the high power deposited insulation layer 112', the annealing step is performed subsequently, the processing temperature of the annealing step is around 230° C., and the annealing step is performed in around 120 minutes. Based on FIGS. 2D to 2F, specially FIG. 2E, the oxide channel layer 106' which contacts with the high power deposited insulation layer 112' is distinctly divided into top and bottom layers, wherein the top layer 106T' contacts with the high power deposited insulation layer 112' and has a relatively more unflattened structure than the bottom layer 106B', and the bottom layer 106B' is relatively closer to the gate insulating layer 104' and has a relatively more flattened structure than the top layer 106T'. Base on lattice points P presented by the diffraction pattern in FIG. 2F, it can be further understood that crystalline structure of the top layer 106T' generally is a face-centered cubic (FCC) structure.

Base on FIGS. 2A to 2F, when the high power depositing step and the annealing step are sequentially performed, the crystalline structure of the oxide channel layer 106, 106', or 106" at the portion closer to the high power deposited insulation layer 112, 112', or 112" is changed, so as to generate the top layer and the bottom layer with different crystalline structures. After the high power depositing step and the annealing step are performed, the top layer 106T, 106T', or 106T" is formed to have a structure with a higher degree of crystallinity, which facilitates to block light. Therefore, the oxide channel layer 106, 106', or 106" of the active device structure 10, 10', or 10" of this embodiment is not easily affected by the light irradiation so that the electrons therein can be prevented from jumping to the conduction band early. In addition, threshold voltage shift of the active device structure 10, 10', or 10" does not easily occur so that the active device structure 10, 10', or 10" has a better stability.

Figure 3:
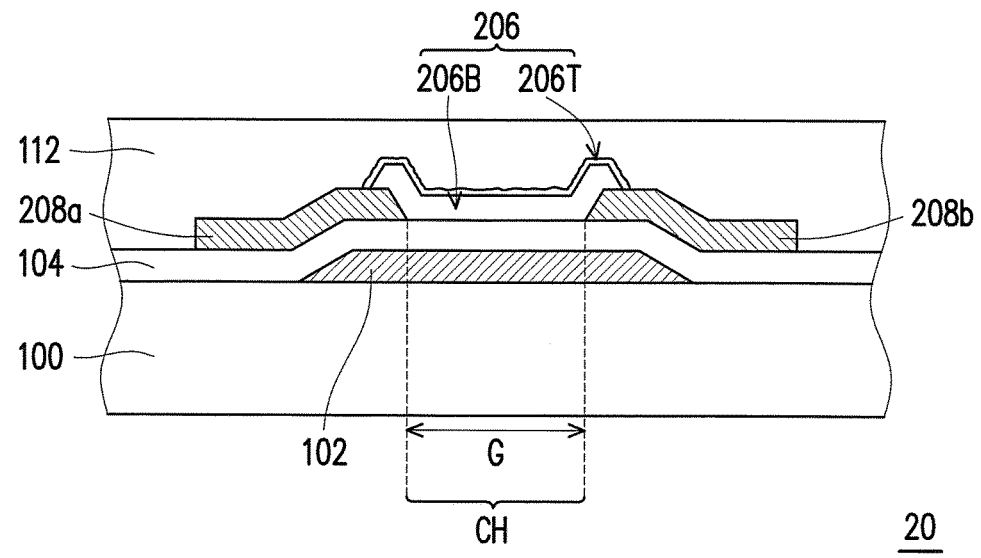
FIG. 3 is a schematic cross-section view of an active device structure of the second embodiment of the invention.

FIG. 3 is a schematic cross-section view of an active device structure of the second embodiment of the invention. This embodiment is another design of the bottom gate structure. Referring to FIG. 3, the active device structure 20 includes the gate 102 formed on the substrate 100, the gate insulating layer 104, the oxide channel layer 206, the source 208a, the drain 208b, and the high power deposited insulation layer 112. In addition, the oxide channel layer 206 and the gate 102 are overlapped in a top and bottom manner. The source 208a and the drain 208b both contact with the oxide channel layer 206, and the gap G separating the source 208a and the drain 208b defines the channel area CH on the oxide channel layer 206. Furthermore, the source 208a and the drain 208b locate between the oxide channel layer 206 and the gate 102. The high power deposited insulation layer 112 covers the oxide channel layer 206. In this embodiment, the gate 102, the source 208a, and the drain 208b all locate between the oxide channel layer 206 and the substrate 100.

The method of fabricating the active device structure 20 is generally similar to the above-mentioned method of fabricating the active device structure 10, wherein the process of fabricating the active device structure 20 is that, firstly, the source 208a and the drain 208b are fabricated on the gate insulating layer 104, and then, the oxide channel layer 206 is fabricated. The etchant for patterning the source 208a and the drain 208b is used before the oxide channel layer 206 is formed. Therefore, the probability that the oxide channel layer 206 contacts with the etchant during the fabricating process is reduced. In addition, after the high power deposited insulation layer 112 is completely fabricated, the annealing step is subsequently performed. Therefore, the oxide channel layer 206 includes the top layer 206T and the bottom layer 206B, the top layer 206T locates between the high power deposited insulation layer 112 and the bottom layer 206B, wherein the crystalline structure of the top layer 206T is different from the crystalline structure of the bottom layer 206B. Specifically, the degree of crystallinity of the top layer 206T is higher than the degree of crystallinity of the bottom layer 206B. Therefore, in this embodiment, the top layer 206T can provide the effect of blocking light, so as to prevent the oxide channel layer 206 of the active device structure 20 from being illuminated, and the phenomenon that the electrons jump to the conduction band early can be mitigated. Hence, the threshold voltage shift of the active device structure 20 does not easily occur so that the active device structure 20 has a better stability.

Figure 4:
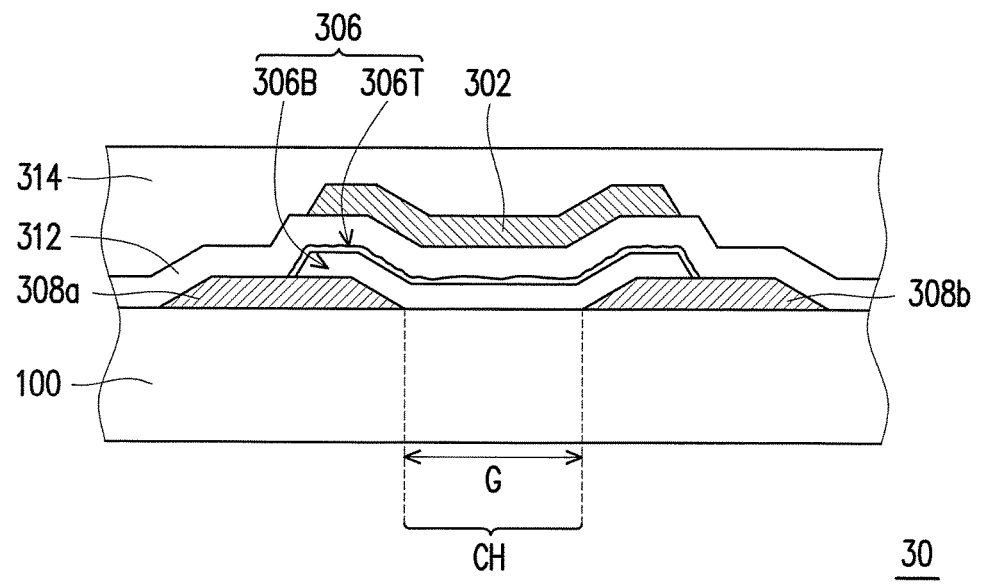
FIG. 4 is a schematic cross-section view of an active device structure of the third embodiment of the invention.

FIG. 4 is a schematic cross-section view of an active device structure of the third embodiment of the invention. The embodiment in FIG. 4 is a design of the top gate structure, in this embodiment the gate 302 of the active device structure 30 locates above the oxide channel layer 306. To be more specific, the active device structure 30 includes the source 308a formed on the substrate 100, the drain 308b, the oxide channel layer 306, the high power deposited insulation layer 312, the gate 302, and the protective layer 314. The gate 302 and the oxide channel layer 306 are overlapped in a top and bottom manner. The source 308a and the drain 308b both contact with the oxide channel layer 306, and the gap G separating the source 308a and the drain 308b defines the channel area CH on the oxide channel layer 306. The high power deposited insulation layer 312 locates between the gate 302 and the oxide channel layer 306. The protective layer 314 is formed above the gate 302. Therefore, the protective layer 314 covers the gate 302 and the high power deposited insulation layer 312. In this embodiment, the high power deposited insulation layer 312 locates between the gate 302 and the oxide channel layer 306, so that the high power deposited insulation layer 312 can be considered as a gate insulating layer.

The process of fabricating the active device structure 30 is that, firstly, the source 308a and the drain 308b are fabricated on the substrate 100, and then, the oxide channel layer 306, the gate 302, and the protective layer 314 are fabricated, wherein the processing condition of the high power deposited insulation layer 312 can be referred to the processing condition of the high power deposited insulation layer 112 of the above-mentioned embodiment. After the high power deposited insulation layer 312 is completely fabricated and before the gate 302 is fabricated, the annealing step is performed in the fabricating method according to this embodiment, wherein the specific processing condition of the annealing step is referred to the description of FIG. 1F. Moreover, after performing the high power depositing step and annealing step the oxide channel layer 306 is divided into the bottom layer 306B and the top layer 306T located between the high power deposited insulation layer 312 and the bottom layer 306B, wherein the crystalline structure of the top layer 306T is different from the crystalline structure of the bottom layer 306B. Specifically, the degree of crystallinity of the top layer 306T is higher than the degree of crystallinity of the bottom layer 306B. Therefore, in this embodiment, the top layer 306T can provide the effect of blocking light, so as to prevent the oxide channel layer 306 of the active device structure 30 from being illuminated and the phenomenon that the electrons jump to the conduction band early can be mitigated. Hence, the threshold voltage shift of the active device structure 30 does not easily occur so that the active device structure 30 has a better stability.

Figure 5:
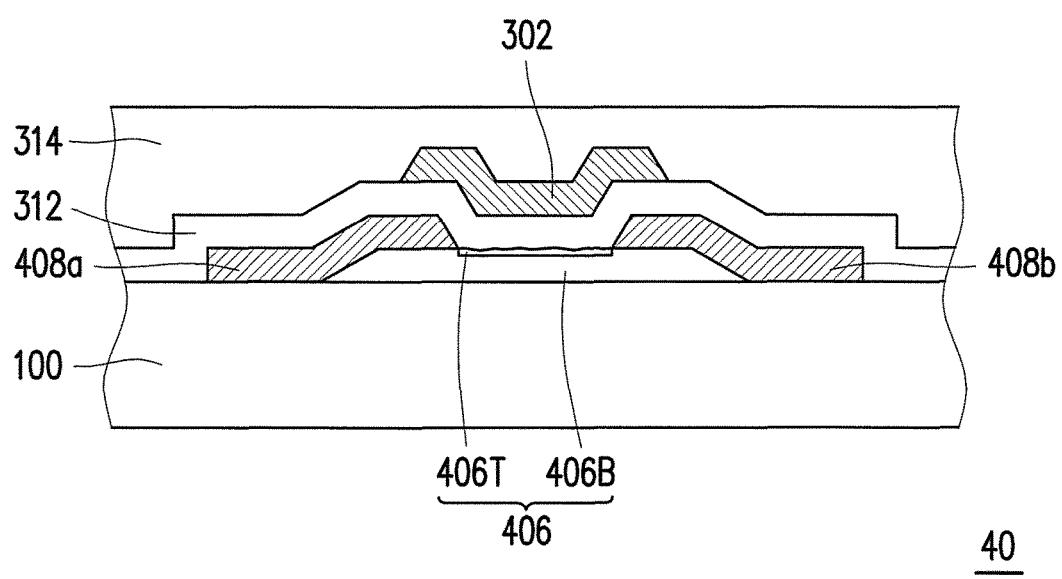
FIG. 5 is a schematic cross-section view of an active device structure of the fourth embodiment of the invention.

FIG. 5 is a schematic cross-section view of an active device structure of the fourth embodiment of the invention. This embodiment is another design of the top gate structure. Referring to FIG. 5, the relative configuration of the active device structure 40 is generally similar to the active device structure 30, but the advantage of the steps of fabricating the oxide channel layer 406 is the fabricating step of the source 408a and the drain 408b so that the source 408a and the drain 408b of the active device structure 40 locate between the oxide channel layer 406 and the high power deposited insulation layer 312. The same as the above-mentioned embodiment, the oxide channel layer 406 is divided into the top layer 406T having higher degree of crystallinity and the bottom layer 406B having lower degree of crystallinity, and the top layer 406T locates between the bottom layer 406B and the high power deposited insulation layer 312 which is considered as a gate insulating layer. Therefore, the method of fabricating each component, the relative configuration, and function of the active device structure 40 can refers to the description of the above-mentioned embodiment so that the details are not repeated.

In summary, in the active device structure of the embodiments of the invention, after the oxide channel layer is fabricated, the high power depositing step and the annealing step are sequentially performed to fabricate the high power deposited insulation layer which contacts the oxide channel layer, the portion of the oxide channel layer which contacts the high power deposited insulation layer can be changed during the fabrication process and divided into the top and bottom layers, wherein the top layer is closer to the high power deposited insulation layer and has the crystalline structure with a higher degree of crystallinity than the bottom layer. Because of having higher degree of crystallinity, the top layer can provide the effect of blocking light, and the threshold voltage shift problem of the active device structure that is a result of the carrier transitioning easily when the oxide channel layer is exposed to light irradiation is efficiently mitigated, so as to increase the stability of the active device structure.

Although the invention has been disclosed with reference to the aforesaid embodiments, they are not intended to limit the invention. It will be apparent to one of ordinary skill in the art that modifications and variations to the described embodiments may be made without departing from the spirit and the scope of the invention. Accordingly, the scope of the invention will be defined by the attached claims and not by the above detailed descriptions.

What is claimed is:

1. An active device structure, comprising:
   a gate;
   an oxide channel layer, located over or under the gate, wherein the oxide channel layer comprises a top layer and a bottom layer having a crystalline structure different from a crystalline structure of the top layer, wherein the crystalline structure of the top layer is a body-centered cubic (BBC) or a face-centered cubic (FCC), and a degree of crystallinity of the top layer is higher than a degree of crystallinity of the bottom layer;
a source, contacting the oxide channel layer;
a drain, contacting the oxide channel layer, wherein a gap separating the source and the drain defines a channel area on the oxide channel layer; and
an insulation layer, contacting the top layer of the oxide channel layer.

2. The active device structure as recited in claim 1, wherein a material of the insulation layer comprises silicon oxide.

3. The active device structure as recited in claim 1, wherein a ratio of a thickness of the top layer to a thickness of the bottom layer is from 1:5 to 1:9.

4. The active device structure as recited in claim 1, wherein the bottom layer has an amorphous crystalline structure.

5. The active device structure as recited in claim 1, wherein an oxygen content of the top layer is lower than an oxygen content of the bottom layer.

6. The active device structure as recited in claim 1, further comprising a gate insulating layer, wherein the gate insulating layer is located between the gate and the oxide channel layer, and the oxide channel layer, the source, and the drain are located between the insulation layer and the gate insulating layer.

7. The active device structure as recited in claim 1, further comprising a protective layer, wherein the insulation layer is located between the gate and the oxide channel layer, and the protective layer covers the gate and the insulation layer.

8. The active device structure as recited in claim 1, wherein a material of the top layer and the bottom layer of the oxide channel layer comprises indium gallium zinc oxide.

9. The active device structure as recited in claim 1, wherein a surface area of the top layer of the oxide channel layer is approximately equal to a contact area of the oxide channel layer in contact with the insulation layer.

10. A method of fabricating an active device structure, comprising:
forming a gate, an oxide channel layer, a source, and a drain, wherein the gate and the oxide channel layer are overlapped in a top and bottom manner, the source and the drain both contact the oxide channel layer, and a gap separating the source and the drain defines a channel area on the oxide channel layer;

performing a high power depositing step to form an insulation layer contacting the oxide channel layer, wherein a value of energy density of the high power depositing step is from 0.14 W/cm$^2$ to 0.37 W/cm$^2$; and
performing an annealing step, such that the oxide channel layer comprises a bottom layer and a top layer contacting with the insulation layer, and a crystalline structure of the top layer is different from a crystalline structure of the bottom layer, wherein the crystalline structure of the top layer is a body-centered cubic (BBC) or a face-centered cubic (FCC), and a degree of crystallinity of the top layer is higher than a degree of crystallinity of the bottom layer, wherein a processing temperature of the annealing step is from 200° C. to 300° C.

11. The method for fabricating the active device structure as recited in claim 10, wherein a value of energy density of the high power depositing step is from 0.21 W/cm$^2$ to 0.28 W/cm$^2$.

12. The method for fabricating the active device structure as recited in claim 10, wherein the annealing step is performed under atmospheric environment.

13. The method for fabricating the active device structure as recited claim 10, wherein the processing temperature of the annealing step is 230° C., and a processing duration of the annealing step is 120 minutes.

14. The method for fabricating the active device structure as recited claim 10, wherein the annealing steps is performed after the high power depositing step.

15. The method for fabricating the active device structure as recited claim 10, wherein the insulation layer is formed between the gate and the oxide channel layer.

16. The method for fabricating the active device structure as recited in claim 10, further comprising forming a gate insulating layer between the gate and the oxide channel layer, and the oxide channel layer, the source, and the drain being located between the insulation layer and the gate insulating layer.

17. The method for fabricating the active device structure as recited in claim 10, wherein a material of the insulation layer is silicon oxide.

18. The active device structure as recited in claim 1, wherein the insulation layer is formed by a high power depositing step, and a value of energy density of the high power depositing step is from 0.14 W/cm$^2$ to 0.37 W/cm$^2$.

* * * * *